(12) United States Patent
Gurary et al.

(10) Patent No.: US 12,322,644 B2
(45) Date of Patent: Jun. 3, 2025

(54) REACTOR WITH CENTERING PIN FOR EPITAXIAL DEPOSITION

(71) Applicant: Veeco Instruments Inc., Plainview, NY (US)

(72) Inventors: Alexander Gurary, Bridgewater, NJ (US); Sandeep Krishnan, Jersey City, NJ (US); Aniruddha Bagchi, Belle Mead, NJ (US); Yuliy Rashkovsky, Milburn, NJ (US); Siddharth Patel, East Windsor, NJ (US)

(73) Assignee: Veeco Instruments, Inc., Plainview, CA (US)

( * ) Notice: Subject to any disclaimer, the term of this patent is extended or adjusted under 35 U.S.C. 154(b) by 129 days.

(21) Appl. No.: 17/458,768

(22) Filed: Aug. 27, 2021

(65) Prior Publication Data

US 2022/0068700 A1    Mar. 3, 2022

Related U.S. Application Data

(60) Provisional application No. 63/074,306, filed on Sep. 3, 2020.

(51) Int. Cl.
*H01L 21/687* (2006.01)
*C23C 16/458* (2006.01)
*C30B 25/12* (2006.01)

(52) U.S. Cl.
CPC .... *H01L 21/68785* (2013.01); *C23C 16/4584* (2013.01); *C30B 25/12* (2013.01); *H01L 21/68757* (2013.01); *H01L 21/68792* (2013.01)

(58) Field of Classification Search
None
See application file for complete search history.

(56) References Cited

U.S. PATENT DOCUMENTS

| 3,408,982 A | 11/1968 | Capita |
| 4,368,098 A | 1/1983 | Manasevit |

(Continued)

FOREIGN PATENT DOCUMENTS

| EP | 0591086 A2 | 4/1994 |
| JP | S61-135113 A | 6/1986 |

(Continued)

OTHER PUBLICATIONS

English Machine translation of JP2007211336A, sourced from google on Oct. 19, 2023, https://patents.google.com/patent/JP2007211336A/en?q=(susceptor+thermocouple+center)&oq=susceptor+thermocouple+center (Year: 2007).*

(Continued)

*Primary Examiner* — Jeffrie R Lund
*Assistant Examiner* — Tiffany Z Nuckols
(74) *Attorney, Agent, or Firm* — Rauschenbach Patent Law Group, PLLC; Kurt Rauschenbach (57) ABSTRACT

A substrate reactor with centering pin for epitaxial deposition includes a vacuum chamber and a tube configured to rotate in the vacuum chamber around a tube geometrical center axis. A substrate carrier forming a pocket dimensioned for holding a substrate on a top surface includes an aperture that is centrally located on a bottom surface. The substrate carrier is positioned on and in contact with a top surface of the tube. A centering pin is positioned along a geometrical center axis of rotation of the substrate carrier. The centering pin has a first end positioned in the aperture on the bottom surface of the substrate carrier and a second end fixed inside the reactor so that the substrate carrier rotates around the geometrical center axis of the substrate carrier independent of the geometrical center axis of the tube.

36 Claims, 5 Drawing Sheets

(56) References Cited

U.S. PATENT DOCUMENTS

| | | | |
|---|---|---|---|
| 4,404,265 | A | 9/1983 | Manasevit |
| 4,839,145 | A | 6/1989 | Gale et al. |
| 5,077,875 | A | 1/1992 | Hoke et al. |
| 5,088,444 | A | 2/1992 | Ohmoine et al. |
| 5,152,842 | A | 10/1992 | Urata et al. |
| 5,226,383 | A | 7/1993 | Bhat |
| 5,421,893 | A | 6/1995 | Perlov |
| 5,624,499 | A | 4/1997 | Mizuno et al. |
| 5,759,281 | A | 6/1998 | Gurary et al. |
| 5,840,124 | A | 11/1998 | Gurary et al. |
| 5,920,797 | A | 7/1999 | Ballance et al. |
| 6,001,175 | A | 12/1999 | Maruyama et al. |
| 6,001,183 | A | 12/1999 | Gurary et al. |
| 6,113,705 | A | 9/2000 | Ohashi et al. |
| 6,125,740 | A | 10/2000 | Hedrington et al. |
| 6,153,012 | A | 11/2000 | Rupp et al. |
| 6,190,113 | B1 | 2/2001 | Bui et al. |
| 6,309,465 | B1 | 10/2001 | Jurgensen et al. |
| 6,492,625 | B1 | 12/2002 | Boguslavskiy et al. |
| 6,506,252 | B2 | 1/2003 | Boguslavskiy et al. |
| 6,596,973 | B1 * | 7/2003 | Donald ............ H01L 21/67248 219/390 |
| 6,685,774 | B2 | 2/2004 | Boguslavskiy et al. |
| 6,726,769 | B2 | 4/2004 | Boguslavskiy et al. |
| 10,718,053 | B2 | 7/2020 | Tomizawa et al. |
| 2003/0178145 | A1 | 9/2003 | Anderson et al. |
| 2008/0210169 | A1 * | 9/2008 | Pozzetti ............ H01L 21/6838 118/730 |
| 2010/0186666 | A1 * | 7/2010 | Kappeler ................ C30B 25/12 118/641 |
| 2012/0171870 | A1 * | 7/2012 | Mitrovic ........... C23C 16/45508 438/758 |
| 2014/0261698 | A1 * | 9/2014 | Krishnan ................ C30B 25/12 118/728 |
| 2016/0218024 | A1 * | 7/2016 | Kobayashi ........ H01L 21/67103 |
| 2020/0234996 | A1 * | 7/2020 | Rokkam ............ H01L 21/6875 |
| 2020/0248307 | A1 | 8/2020 | Gurary et al. |

FOREIGN PATENT DOCUMENTS

| | | | |
|---|---|---|---|
| JP | H10-22226 | A | 1/1988 |
| JP | H03-16122 | A | 1/1991 |
| JP | H10-189469 | A | 7/1998 |
| JP | 2007211336 | A * | 8/2007 |
| WO | 1997/009737 | A1 | 3/1997 |
| WO | 1998/032893 | A2 | 7/1998 |
| WO | 2001/007691 | A1 | 2/2001 |

OTHER PUBLICATIONS

Jones et al., Chemical Vapour Deposition: Precursors, Processes and Applications, Royal Society of Chemistry, Advanced Micro-Fabrication Equipment, Inc., Ex. 1014, 2009, 39 pages.

Jones et al., CVD of Compound Semiconductors: Precursor Synthesis, Development and Applications, Advanced Micro-Fabrication Equipment, Inc., Ex. 1017, 1997, 23 pages.

Letter Regarding Opposition received in European Patent Application No. 01964250.3, mailed on Jan. 13, 2017, 38 pages.

Complaint for Invalidation Trial received in Korean Patent Application No. 10-2003-7010387, mailed on Aug. 14, 2017, 303 pages including 137 pages of English Translation.

Complaint filed for Chinese Patent Application No. 201220056049.5, mailed on Jun. 30, 2017, 12 pages including 7 pages of English Translation.

Petition for Inter Partes Review of U.S. Pat. No. 6,726,769 B2, under 35 U.S.C. §§ 311-319 and 37 C.F.R. § 42.100 Et Seq., mailed on Dec. 8, 2017, 76 pages.

Office Action received for Taiwan Patent Application No. 110209735, mailed on Jan. 25, 2022, 4 pages (2 pages of English Translation and 2 pages of Official Copy).

Office Action received for Taiwan Patent Application No. 110209735, mailed on Apr. 29, 2022, 4 pages (2 pages of English Translation and 2 pages of Official Copy).

Notice of Allowance received for Taiwan Patent Application No. 110209735, mailed on Jul. 18, 2022, 3 pages (1 page of English Translation and 2 pages of Official Copy).

Office Action received for Taiwan Patent Application No. 110209735 mailed on Oct. 29, 2021, 6 pages (3 pages of English Translation and 3 pages of Official Copy.

* cited by examiner

REACTOR WITH CENTERING PIN FOR EPITAXIAL DEPOSITION

The section headings used herein are for organizational purposes only and should not be construed as limiting the subject matter described in the present application in any way.

CROSS REFERENCE TO RELATED APPLICATION

The present application is a non-provisional application of U.S. Provisional Patent Application No. 63/074,306, entitled "Reactor with Centering Pin for Epitaxial Deposition" filed on Sep. 3, 2020. The entire contents of U.S. Provisional Patent Application No. 63/074,306 are herein incorporated by reference.

INTRODUCTION

Many material processing systems include substrate carriers for supporting substrates during epitaxial deposition processing. The substrate is often a disc of crystalline material that is commonly called a wafer or substrate in the art. One such type of material processing system is a vapor phase epitaxy (VPE) system. Vapor phase epitaxy is a type of chemical vapor deposition (CVD) which involves directing one or more gases containing chemical species onto a surface of a substrate so that the reactive species react and form a film on the surface of the substrate. For example, VPE can be used to grow compound semiconductor materials on substrates.

Materials are typically grown by injecting at least one precursor gas and, in many processes, at least a first and a second precursor gas into a process chamber containing the crystalline substrate. Compound semiconductors, such as III-V and II-VI semiconductors, can be formed by growing various layers of semiconductor materials on a substrate using a hydride precursor gas and an organometallic precursor gas. Metalorganic vapor phase epitaxy (MOVPE) is a vapor deposition method that is commonly used to grow compound semiconductors using a surface reaction of metalorganics and hydrides containing the required chemical elements. For example, indium phosphide could be grown in a reactor on a substrate by introducing trimethylindium and phosphine.

Alternative names for MOVPE used in the art include organometallic vapor phase epitaxy (OMVPE), metalorganic chemical vapor deposition (MOCVD), and organometallic chemical vapor deposition (OMCVD). In these processes, the gases react with one another at the growth surface of a substrate, such as a sapphire, Si, GaAs, InP, InAs or GaP substrate, to form a III-V compound of the general formula $In_XGa_YAl_ZN_AAs_BP_CSb_D$, where X+Y+Z equals approximately one, A+B+C+D equals approximately one, and each of X, Y, Z, A, B, C, and D can be between zero and one. In various processes, the substrate can be a metal, semiconductor, or an insulating substrate. In some instances, bismuth may be used in place of some or all of the other Group III metals.

Compound semiconductors, such as III-V semiconductors, can also be formed by growing various layers of semiconductor materials on a substrate using a hydride or a halide precursor gas process. In one halide vapor phase epitaxy (HVPE) process, Group III nitrides (e.g., GaN, AlN) are formed by reacting hot gaseous metal chlorides (e.g., GaCl or AlCl) with ammonia gas ($NH_3$). The metal chlorides are generated by passing hot HCl gas over the hot Group III metals. One feature of HVPE is that it can have a very high growth rate, up to 100 μm per hour for some state-of-the-art processes. Another feature of HVPE is that it can be used to deposit relatively high-quality films because films are grown in a carbon free environment and because the hot HCl gas provides a self-cleaning effect.

In these processes, the substrate is maintained at an elevated temperature within a reaction chamber. The precursor gases are typically mixed with inert carrier gases and are then directed into the reaction chamber. Typically, the gases are at a relatively low temperature when they are introduced into the reaction chamber. As the gases reach the hot substrate, their temperature, and hence their available energy for reaction, increases. Formation of the epitaxial layer occurs by final pyrolysis of the constituent chemicals at the substrate surface. Crystals are formed by a chemical reaction on the surface of the substrate and not by physical deposition processes. Consequently, VPE is a desirable growth technique for thermodynamically metastable alloys. Currently, VPE is commonly used for manufacturing laser diodes, solar cells, and light emitting diodes (LEDs) as well as power electronics.

It is highly desirable in CVD deposition to be able to deposit very uniform films across the entire substrate. The presence of non-uniform temperature profiles across the substrate during deposition leads to non-uniform deposited films. Methods and apparatus that improve uniformity of the thermal profile across the substrate over the duration of the deposition are needed to improve yield.

SUMMARY OF THE INVENTION

Substrate carriers according to the present teaching rotate along with a tube or jar but use a centering pin so that they rotate around their own geometrical center axis rather than the geometrical center axis of the tube. This configuration improves temperature non-uniformities across the substrate during processing. In one embodiment of the present teaching, the substrate reactor includes a vacuum chamber and a tube configured to rotate in the vacuum chamber around a tube geometrical center axis. The substrate carrier forms at least one pocket dimensioned to hold at least one substrate on its top surface. Also, the substrate carrier includes an aperture centrally located on the bottom surface. The substrate carrier is positioned on and in contact with the top surface of the tube so that the tube rotates the substrate carrier along its edges. The centering pin is positioned along a geometrical center axis of rotation of the substrate carrier. A first end of the centering pin is positioned in the aperture on the bottom surface of the substrate carrier. A second end of the centering pin is fixed inside the reactor so that the substrate carrier rotates around its own geometrical center axis independent of the geometrical center axis of the tube.

In another embodiment of the present teaching, the substrate reactor also includes a vacuum chamber and a tube configured to rotate in the vacuum chamber around the tube's geometrical center axis with the substrate carrier forming at least one pocket on its top surface that is dimensioned for holding at least one substrate. The substrate carrier includes an aperture with the frustoconical-shaped outer surface centrally located on the bottom surface. A centering pin is positioned along a geometrical center axis of rotation of the substrate carrier with a first end that forms a frustoconical-shaped outer surface that fits into the aperture with the frustoconical-shaped outer surface on the bottom surface of the substrate carrier. A second end of the centering pin is fixed inside the substrate reactor so that the substrate carrier rotates around the geometrical center axis of rotation of the substrate carrier independent of the tube geometrical center axis. The substrate carrier is positioned proximate to a top surface of the tube forming a gap therebetween at room temperature. The frustoconical-shaped outer surface of the aperture is in direct contact with the frustoconical-shaped outer surface of the first end of the centering pin so that a gap is formed in the vertical dimension between the tip of the first end of the centering pin and the outer surface of the aperture.

In another embodiment of the present teaching, the substrate reactor also includes a vacuum chamber and a tube configured to rotate in the vacuum chamber around the tube's geometrical center axis with the substrate carrier forming at least one pocket on its top surface that is dimensioned for holding at least one substrate. The substrate carrier includes an aperture centrally located on the bottom surface, the aperture having secured therein a bushing. A centering pin is positioned along a geometrical center axis of rotation of the substrate carrier. The center of the bushing is also positioned along the geometrical center axis of rotation of the substrate carrier. A first end of the centering pin is positioned in the aperture on the bottom surface of the substrate carrier. A second end of the centering pin is fixed inside the reactor so that the substrate carrier rotates around its own geometrical center axis independent of the geometrical center axis of the tube.

A substrate carrier also forms another embodiment of the present teaching where a plate has a top surface, a bottom surface, and a geometrical center of axis of rotation. The top surface is dimensioned for holding at least one substrate. The bottom surface has a peripheral section and a central section. The central section has formed therein an aperture which is centrally located and aligned with the plate's geometrical center of axis of rotation. The peripheral section is adapted to contact with the top surface of a tube, the tube being configured to rotate around a tube geometrical center axis. The aperture is dimensioned to receive a centering pin along the geometrical center of axis of rotation of the plate such that the plate rotates along its geometrical center of axis of rotation independent of the tube geometrical center axis.

BRIEF DESCRIPTION OF THE DRAWINGS

The present teaching, in accordance with preferred and exemplary embodiments, together with further advantages thereof, is more particularly described in the following detailed description taken in conjunction with the accompanying drawings. The skilled person in the art will understand that the drawings, described below, are for illustration purposes only. The drawings are not necessarily to scale, emphasis instead generally being placed upon illustrating principles of the teaching. In the drawings, like reference characters generally refer to like features and structural elements throughout the various figures. The drawings are not intended to limit the scope of the Applicants' teaching in any way.

DESCRIPTION OF VARIOUS EMBODIMENTS

The present teaching will now be described in more detail with reference to exemplary embodiments thereof as shown in the accompanying drawings. Reference in the specification to "one embodiment" or "an embodiment" means that a particular feature, structure, or characteristic, described in connection with the embodiment, is included in at least one embodiment of the teaching. The appearances of the phrase "in one embodiment" in various places in the specification are not necessarily all referring to the same embodiment.

It should be understood that the individual steps used in the methods of the present teachings may be performed in any order and/or simultaneously, as long as the teaching remains operable. Furthermore, it should be understood that the apparatus and methods of the present teachings can include any number, or all, of the described embodiments, as long as the teaching remains operable.

While the present teaching is described in conjunction with various embodiments and examples, it is not intended that the present teachings be limited to such embodiments. On the contrary, the present teachings encompass various alternatives, modifications, and equivalents, as will be appreciated by those of skill in the art. Those of ordinary skill in the art, having access to the teaching herein, will recognize additional implementations, modifications, and embodiments, as well as other fields of use, which are within the scope of the present disclosure as described herein.

Recently, there has been tremendous growth in the LED and OLED markets. Also, there have been significant advances in power semiconductors, which have increased their utility. Consequently, there has been an increased demand for efficient and high throughput CVD and MOCVD manufacturing systems and methods to fabricate these devices. There is a particular need for manufacturing systems and methods that improve deposition uniformity without negatively impacting the maintenance and operating parameters, such as rotation rate of the substrate carrier. It is well known that the presence of non-uniform temperature profiles across the substrate during deposition leads to non-uniform deposited films.

The present teaching relates to methods and apparatus for chemical vapor deposition, including MOCVD. More particularly, the present teaching relates to methods and apparatus for chemical vapor deposition using vertical reactors in which the substrates are located on a substrate carrier that is positioned on a rotating cylinder or tube that serves as a rotating support comprising an edge that supports the substrate carrier.

Various aspects of the present teaching are described in connection with a single substrate CVD reactor. However, one skilled in the art will appreciate that the methods and apparatus of the present teaching can be implemented with a multi-substrate reactor. In addition, the CVD reactor and substrate carrier of the present teaching can be scaled to any size substrate.

Also, various aspects of the present teaching are described in connection with a support for the substrate carrier in the CVD reactor that supports the various embodiments of the substrate carrier. The support is referred to in the art by various terms such as "support", "cylindrical support", "rotating support", "drum", rotating drum" "tube", "rotating tube", "drum" or "rotating drum". For simplicity, the support is often referred to in this disclosure as a tube or rotating tube.

There are known single substrate CVD reactors that use a rotating tube with a multi-zone heater assembly where the substrate carrier is supported at the perimeter by the rotating tube. See, for example, U.S. Patent Publication No. 2020/0248307, entitled Rotating Disk Reactor with Self-Locking Carrier-to-Support Interface for Chemical Vapor Deposition, which is assigned to the present assignee and which is incorporated herein by reference. The multi-zone heating assembly is positioned under the substrate carrier inside the rotating tube and includes at least two independently controllable heating zones that control the temperature of the substrate carrier to a desired temperature for chemical vapor deposition process. A gas manifold is positioned over the substrate carrier so as to distribute process gasses into a reaction area proximate to the top surface of the substrate carrier that is proximate to the substrate carrier. A motor rotates the tube.

In these systems, there is typically a diametral gap between the substrate carrier and the rotating tube that allows for carrier loading. However, the width of this gap can change during heating because the substrate carrier and the rotating tube can and, often does, have different coefficients of thermal expansion (CTE) resulting in different expansions as a function of temperature. A small gap at high operating temperatures is required to maintain the integrity of the tube. Because of the changing gap width, these substrate carrier configurations do not spin around the geometrical center of the substrate carrier as the temperature increases. This leads to an undesirable linear, or asymmetric, temperature distribution along the substrate carrier radius. Asymmetric temperature non-uniformities cause deposition uniformities which cannot be compensated by multi-zone heating systems. Consequently, these substrate carriers for CVD reactors suffer from non-uniform asymmetric temperature profiles which result from the substrate carrier not rotating around its geometrical center.

There have been several attempts to improve temperature non-uniformities of single substrate CVD reactors that use a rotating tube. See for example, U.S. Pat. No. 10,718,053, which is also assigned to the present assignee and which is incorporated herein by reference. This patent describes a vertical rim that is positioned and dimensioned such that the substrate carrier does not wobble significantly when it is rotating at the desired rotation rate during normal processing conditions. This can be accomplished by selecting a material for the rotating support that has a coefficient of thermal expansion which is very low compared with the coefficient of thermal expansion of the substrate carrier. In this configuration, as the temperature of the substrate carrier is ramped up to the processing temperature, the substrate carrier expands and the gap between the vertical rim and the inside wall of the rotating support reduces, thereby holding the substrate carrier more firmly and reducing wobble. Reducing substrate carrier eccentricity is desirable because substrate carrier eccentricity can cause an asymmetric temperature profile across the substrate carrier, which can affect CVD deposition properties. Reducing substrate carrier tilt is also desirable. One factor resulting in substrate carrier tilt is horizontal forces acting on the substrate carrier.

Another attempt to improve temperature non-uniformities of single substrate CVD reactors that use a rotating tube, which is also described in U.S. Pat. No. 10,718,053, is the use of a split substrate carrier that comprises a first section and a second section. The first section is supported by second section with ledge. The second section is supported at the perimeter by the rotating tube. In this configuration, there is also a diametral gap between the substrate carrier and the rotating tube that allows for carrier loading. The width of this gap changes during heating because the substrate carrier and the rotating tube have different coefficients of thermal expansion (CTE) resulting in different expansions as a function of temperature.

Yet another attempt to improve temperature non-uniformities of single substrate CVD reactors that use a rotating tube, which is described in U.S. Pat. No. 10,718,053, is a self-centering pocketless substrate carrier CVD that has an edge with a beveled geometry and a flat rim. The edge of the substrate carrier corresponds to a circular region at or near the outer perimeter of the substrate carrier and protrudes from the lower surface of the substrate carrier. A substrate is centered on the upper surface of the substrate carrier by a post. The edge of substrate and post contacts at contact interface.

The substrate carrier is positioned on a rotating support that has an edge with a beveled geometry and a flat rim. The substrate carrier edge and the rotating support edge are proximate and parallel when the substrate carrier is positioned on the rotating support. The bevel geometry on the edge of the rotating support is formed at an angle with respect to the rotation axis of the rotating support. Similarly, the bevel geometry on the edge of the substrate carrier is set at an angle with respect to the center-axis of the carrier that runs normal to the upper surface of the substrate carrier that supports the substrate. The angles are chosen to improve temperature non-uniformities of single substrate CVD reactors.

In particular, a conical-shaped interface between the substrate carrier and the rotating support that has an approximately 45-degree angle is described. The conical interface is designed to provide essentially a zero gap between the substrate carrier and the rotating support at the conical-shaped interface while also providing good carrier centering along the rotation axis of the rotating support. In addition, the conical-shaped interface is chosen to allow the substrate carrier to move vertically upward as the operating temperature increases causing thermal expansion and when the centripetal forces acting in the carrier plane are greater than a threshold value. The approximately 45-degree-angle conical interface between the substrate carrier and the rotating support is chosen to facilitate vertical movement of the substrate carrier during thermal expansion when centripetal forces are greater than a threshold value. However, a conical interface with an approximately 45-degree angle can result in substrate carrier tilting during thermal expansion and vertical movement, particularly when experiencing centripetal forces acting in the carrier plane that is over the threshold value.

One aspect of the present teaching is the realization that temperature non-uniformities of single substrate CVD reactors can be improved by configuring the reactor so that the substrate carrier rotates around its geometrical center axis rather than the geometrical center axis of the tube. In such configurations according to the present teaching, the rotation axis of the substrate carrier is decoupled from the rotation axis of the tube making them independent.

Figure 1:
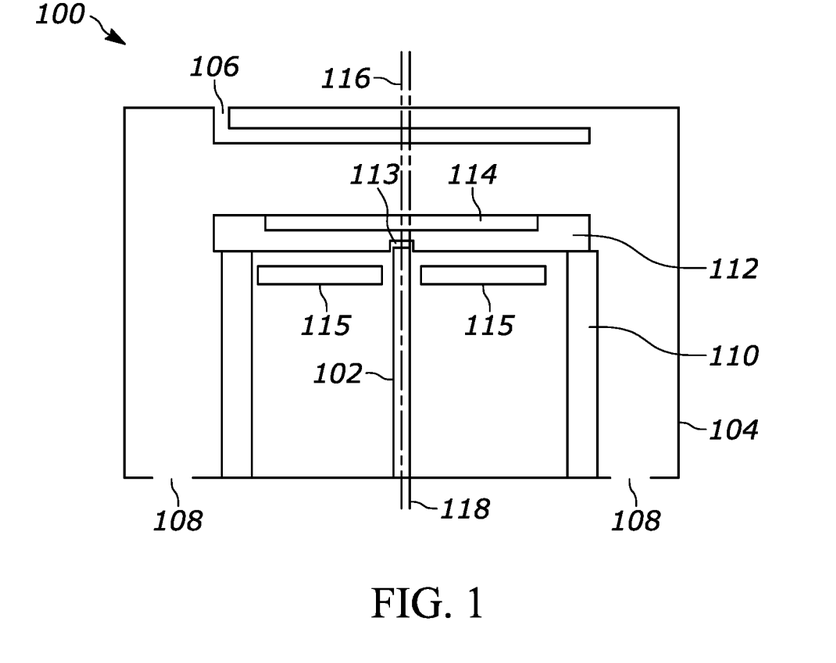
FIG. 1 illustrates a simplified cross-sectional diagram of an embodiment of a reactor with centering pin according to the present teaching for epitaxial deposition.

FIG. 1 illustrates a simplified cross-sectional diagram of an embodiment of a reactor 100 with centering pin 102 according to the present teaching for epitaxial deposition. The reactor 100 includes a vacuum chamber 104 with at least one gas inlet 106 that is coupled to a gas manifold 107 for injecting gas into the reactor proximate to the substrate being processed and at least one exhaust port 108. A substrate support or tube 110 is positioned inside the vacuum chamber 104 and is configure to rotate around a center axis 118 of tube 110. Tubes according to the present teaching can be formed of numerous materials such as quartz, boron nitride, ceramic material, silicon carbide, a refractory material, or graphite. A motor is typically mechanically coupled to the tube 110 so as to rotate the tube 110 at a particular rotation rate for a particular process.

A substrate carrier 112 is supported at the perimeter by the rotating tube 110. Substrate carriers according to the present teaching can be formed of numerous materials such as graphite, silicon carbide, silicon, a refractory material, and a ceramic material. A multi-zone heater assembly 115 is positioned under the substrate carrier 112. The multi-zone heater assembly 115 controls the temperature of the substrate carrier 112 to a desired temperature for chemical vapor deposition process. A multi-zone heating assembly 115 is positioned under the substrate carrier 112 inside the tube 110 and includes at least two independently controllable heating zones. The multi-zone heater assembly 115 controls the temperature of the substrate carrier to a desired temperature for the particular chemical vapor deposition process.

In one embodiment, the substrate carrier 112 is a single wafer or substrate carrier as shown where the pocket 114 is dimensioned for holding a single substrate recessed inside of the substrate carrier 112 during processing. The substrate carrier 112 rotates along with the rotation of the tube 110 due to the friction between the bottom surface of the substrate carrier 112 and the top surface of the tube 110. One aspect of the present teaching is that the bottom surface of the substrate carrier 112 is free to move in the horizontal plane relative to the top surface of the tube 110. The only force resisting this movement is friction. Such a configuration is advantageous because the difference in the thermal expansion between substrate carrier 112 and tube 110 due to their different coefficients of thermal expansion will not result in thermal stress between the substrate carrier 112 and the tube 110. Such thermal stress is a significant problem with known reactors as it can result in temperature non-uniformities and can ultimately result in damage to the one or both of the substrate carrier 112 or tube 110.

As described in more detail below, the substrate carrier 112 forms an aperture 113 that is centrally located on the bottom surface. The aperture 113 is dimensioned to receive the first end (top end) of the centering pin 102. Centering pins according to the present teaching (reference numbers 102, 304, 404, 504, or 602 herein) can be formed from, for example, a refractory material such as silicon carbide, boron nitride, boron carbide, aluminum nitride, alumina, sapphire, quartz, graphite, and combinations thereof, molybdenum, molybdenum alloys, tungsten, tungsten alloys, or high temperature ceramic materials (such as, for example, oxides, carbides, borides, and nitrides of transition metals, for example, hafnium, tantalum, zirconium, titanium, niobium, and related alloys). There is typically both a gap in the vertical dimension and a gap in the horizontal dimension between the outer surfaces of the aperture 113 and the outer surfaces of the centering pin 102 at room temperature. The second end (bottom end) of the centering pin 102 is fixed inside the reactor so that the substrate carrier 112 rotates around the geometrical center axis 116 of the substrate carrier 112 independent of the geometrical center axis 118 of the tube 110, effectively decoupling the geometrical center axis 116 of the substrate carrier 112 from the geometrical axis 118 of the of the tube 110.

The centering pin 102 restrains and centers the substrate carrier 112 so that the substrate carrier 112 rotates around its geometrical axis of rotation 116 independent of the rotation of the tube 110. That is, the geometrical axis of rotation 116 of the substrate carrier 112 is thus independent of the geometrical axis of rotation 118 of the tube 110. The simplified diagram shown in FIG. 1 illustrates that the geometrical axis of rotation 116 of the substrate carrier 112 is different from the geometrical axis of rotation 118 of the tube 110 by a wide distance to illustrate the decoupling of the two axes of rotation. However, it should be understood that, in practice, the geometrical axis of rotation 116 of the substrate carrier 112 will typically be close to geometrical axis of rotation 118 of the tube 110, but will not be in exactly the same location for extended periods of time during rotation.

The centering pin 102 is configured to restrain and center the substrate carrier 112 along its axis of rotation 116. However, the centering pin 102 is not used to provide torque for rotating the substrate carrier 112 and, in fact, does not provide any torque for rotating the substrate carrier 112. Thus, there are only minimal structural requirements for the centering pin 102 such as to be stiff enough so as not to bend significantly during operation. In many embodiments, the diameter of the centering pin 102 is much smaller than the typical diameter of a spindle that is used in conventional multi-substrate reactors to rotate the substrate carrier 112 from a central location. The minimal structural requirements of the centering pin 112 is an advantage of the centering pin according to the present teaching because it is highly desirable use a centering pin with low thermal mass. The resulting low thermal mass is advantageous because very little heat will be transferred away from the portion of the substrate carrier that is positioned proximate to the centering pin 102. This reduced level of heat transfer improves thermal non-uniformities.

Figure 2:
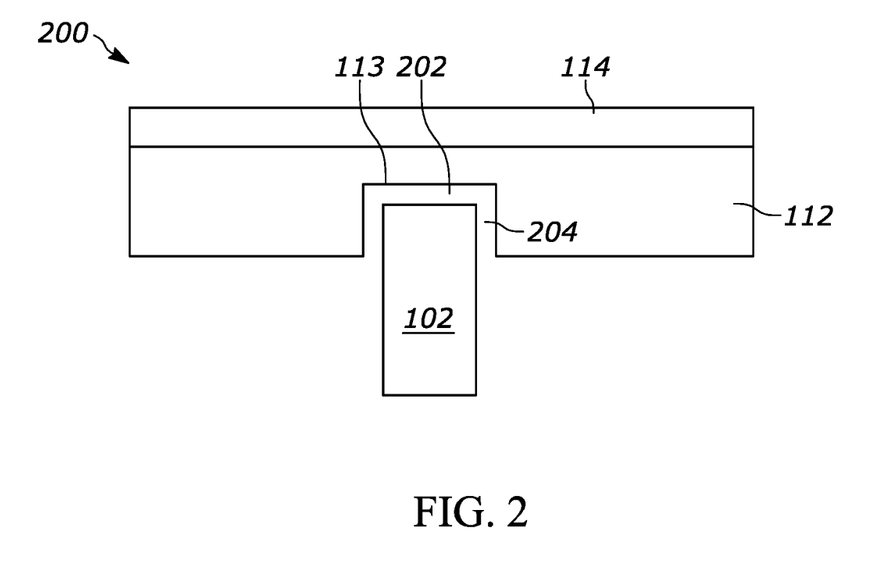
FIG. 2 illustrates an expanded cross-sectional view of the substrate carrier and the centering pin of the reactor according to the present teaching for epitaxial deposition that is described in connection with FIG. 1.

FIG. 2 illustrates an expanded cross-sectional view 200 of the substrate carrier 100 and the centering pin 102 of the reactor with centering pin according to the present teaching for epitaxial deposition that is described in connection with FIG. 1. This expanded view 200 shows a portion of the substrate carrier 112 proximate to the centering pin 102. The pocket 114 that holds the substrate on the top surface of the substrate carrier 112 is also shown.

The expanded view 200 shown in FIG. 2 more clearly illustrates the position of the centering pin 102 relative to the aperture 113. In particular, the expanded view 200 shows that there is a gap 202 in the vertical direction between the vertical outer surface of the centering pin 102 and the vertical outer surface of the aperture 113. In addition, the expanded view 200 shows that there is a gap 204 in the horizontal dimension between the top surface of the centering pin 102 and the adjacent bottom surface of the aperture 113. The dimensions of the centering pin 102 and the dimensions of the aperture 113 are chosen so that both the vertical gap 202 and the horizontal gap 204 are present at room temperature when the substrate carrier 112 is at rest. During rotation of the substrate carrier 112, both the vertical gap 202 and the horizontal gap 204 will change as a function of rotation rate and also as a function of operating temperature.

In various embodiments according to the present teaching, the outer surface of the first end (top surface) of the centering pin 102 and the corresponding adjacent outer surface of the aperture 113 are formed in various, and typically matching, shapes to achieve particular performance metrics. One important performance metric is simplifying the transfer of the substrate carrier into and out of the vacuum chamber 104. For example, in one specific embodiment, the outer surface of the first end (top surface) of the centering pin 102 and the corresponding adjacent outer surface of the aperture 113 are formed with matching chamfered surfaces as described in connection with FIG. 3A-B. In addition, the outer surface of the first end (top surface) of the centering pin 102 and the corresponding adjacent outer surface of the aperture 113 can be formed with matching frustoconical shapes as shown in FIG. 4.

Figure 3A:
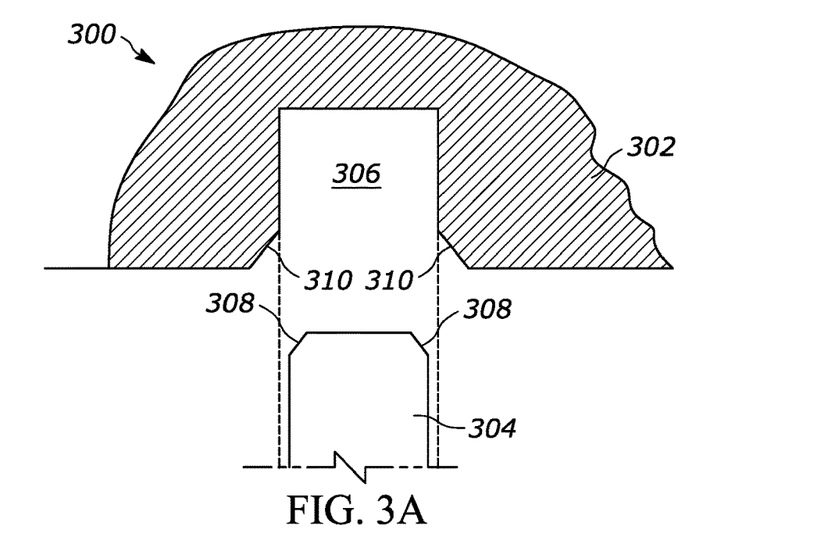
FIG. 3A illustrates an expanded cross-sectional view of a substrate carrier and centering pin of another embodiment of a reactor with centering pin according to the present teaching for epitaxial deposition with the first end of the centering pin and a corresponding adjacent outer surface of an aperture in a bottom surface of the substrate carrier formed with matching chamfered surfaces.

FIG. 3A illustrates an expanded cross-sectional view 300 of a substrate carrier 302 and centering pin 304 of another embodiment of a reactor with centering pin according to the present teaching for epitaxial deposition with the first end of the centering pin 304 and a corresponding adjacent outer surface of an aperture 306 in the bottom surface of the substrate carrier formed with matching chamfered surfaces 308, 310. The chamfered surface angles shown in FIG. 3A are approximately 45 degrees. However, it is understood that other chamfered surface angles can be used depending on the various aspects of the reactor design. Using centering pins and apertures with chamfered surface angles according to the present teaching results in a reactor with improved substrate carrier transport into and out of the reactor. Improved substrate carrier transport will result in increased throughput and higher reliability.

Figure 3B:
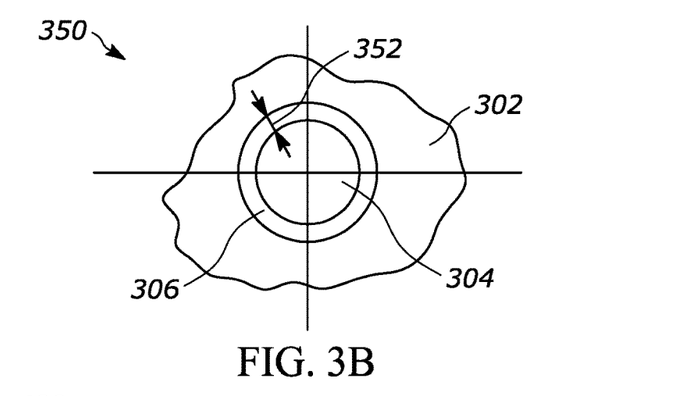
FIG. 3B illustrates a bottom view of the substrate carrier and centering pin that was described in connection with FIG. 3A.

FIG. 3B illustrates a bottom view 350 of the substrate carrier 302 and centering pin 304 that was described in connection with FIG. 3A. The bottom view 350 shows the bottom outer surface of the substrate carrier 302 positioned proximate to the outer surface of aperture 306. The centering pin 304 is shown centered in the aperture 306 with a gap 352 between the outer surface of the centering pin 304 and the outer surface of the aperture 306. The gap 352 is shown as circularly symmetrically. However, it is understood that during rotation of the substrate carrier 302, that the gap 352 will not always be circularly symmetrically. Also, it is understood that, in some embodiments, during operation of the reactor, there will be relative thermal expansion between the substrate carrier 302 and the centering pin 304 due to different expansions of thermal conductivity that may result in changes in the width of the gap 352.

Figure 4:
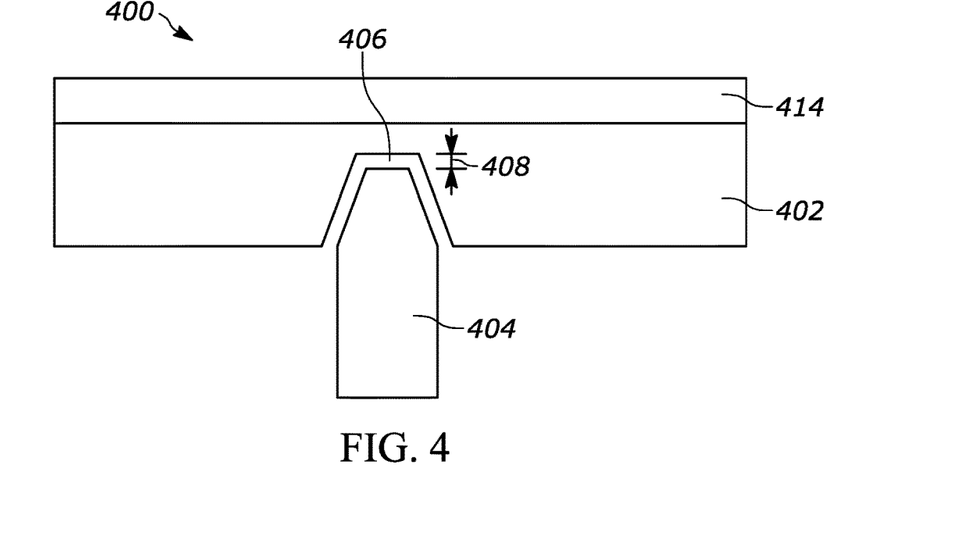
FIG. 4 illustrates an expanded cross-sectional view of a substrate carrier and centering pin of another embodiment of a reactor with centering pin according to the present teaching for epitaxial deposition with the first end of the centering pin and a corresponding adjacent outer surface of an aperture in the bottom surface of the substrate carrier formed with matching frustoconical surfaces.

FIG. 4 illustrates an expanded cross-sectional view 400 of a substrate carrier 402 and centering pin 404 of another embodiment of a reactor with centering pin 404 according to the present teaching for epitaxial deposition with the first end of the centering pin 404 and a corresponding adjacent outer surface of an aperture 406 in the bottom surface of the substrate carrier 402 formed with matching frustoconical surfaces 410, 412. The substrate carrier 402 is shown with pocket 414. There is a gap 408 in the vertical dimension between the frustrum surface of the centering pin 406 and the outer surface of the aperture 406 at room temperature and at operating temperature. The particular frustoconical surface angles shown in FIG. 4 are just one example. It is understood that other frustoconical surface angles can be used depending on the various aspects of the reactor design. Using centering pins and apertures with frustoconical surface angles according to the present teaching results in a reactor with improved substrate carrier transport into and out of the reactor that results in increased throughput and higher reliability.

Figure 5A:
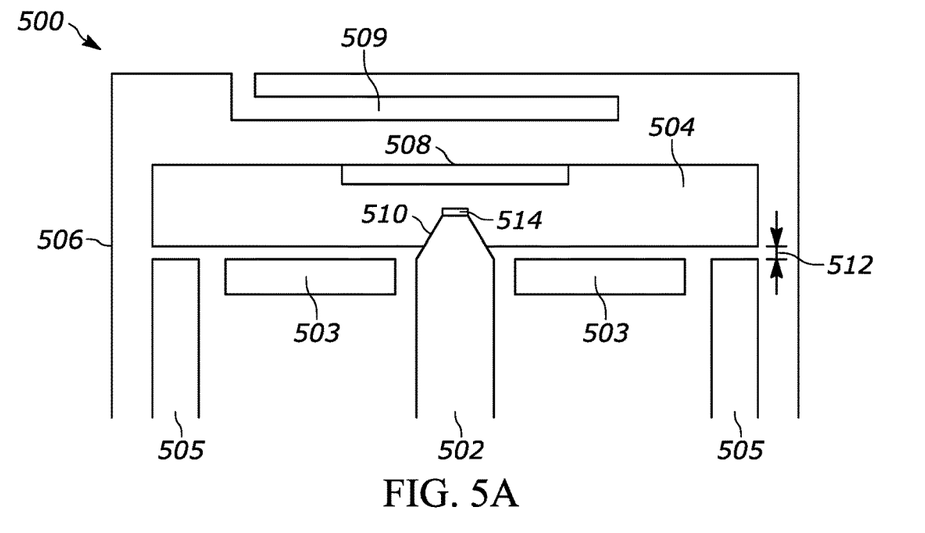
FIG. 5A illustrates a simplified cross-sectional diagram of another embodiment of a reactor with centering pin according to the present teaching for epitaxial deposition.

FIG. 5A illustrates a simplified cross-sectional diagram of another embodiment of a reactor 500 with centering pin 502 according to the present teaching for epitaxial deposition. In this embodiment, the substrate carrier 504 is not positioned in direct contact with the rotating tube 505. The reactor 500, like the reactor 100 of the first embodiment, includes a vacuum chamber 506 where the tube 505 is configured to rotate in the vacuum chamber 506 around the tube's geometrical center axis with the substrate carrier 504 forming a pocket 508 on its top surface that is dimensioned for holding a substrate. A gas manifold 509 is positioned over the substrate carrier 504 so as to distribute process gasses into a reaction area proximate to the top surface of the substrate carrier 504.

Also, like the reactor 100 of the first embodiment, the reactor 500 includes a multi-zone heating assembly 503 that is positioned under the substrate carrier 504 inside the tube 505 and includes at least two independently controllable heating zones. The multi-zone heater assembly 503 controls the temperature of the substrate 504 carrier to a desired temperature for the particular chemical vapor deposition process.

The substrate carrier 504 includes an aperture 510 with a frustoconical-shaped outer surface centrally located on its bottom surface. The centering pin 502 is positioned along a geometrical center axis of rotation of the substrate carrier 504 with a first end that forms a frustoconical-shaped outer surface that fits into the aperture 510 with the frustoconical-shaped outer surface of the aperture 510 on the bottom surface of the substrate carrier 504.

A second end of the centering pin 502 is fixed inside the reactor 500 so that the substrate carrier 504 rotates around the geometrical center axis of rotation of the substrate carrier 504 independent of the tube's geometrical center axis. The substrate carrier 504 is positioned proximate to a top surface of the tube 505 forming a gap 512 therebetween at room temperature. The frustoconical-shaped outer surface of the aperture 510 is in direct contact with the frustoconical-shaped outer surface of the first end of the centering pin 502 so that a gap 514 is formed in the vertical dimension between the tip of the first end of the centering pin 502 and the outer surface of the aperture 510. During operation, the frustoconical-shaped outer surface of the pin 502 can move vertically into and out of the frustoconical-shaped outer surface of the aperture 510 while still maintaining a gap 514 so that it is wide enough so that the substrate carrier 504 does not contact the tube 505. Thus, a gap 512 between the tube 505 and the substrate carrier 504 is maintained during operation. The dimension of gaps 512, 514 change during operation as the frustoconical-shaped outer surface of the pin 502 moves vertically into and out of the frustoconical-shaped outer surface of the aperture 510.

Figure 5B:
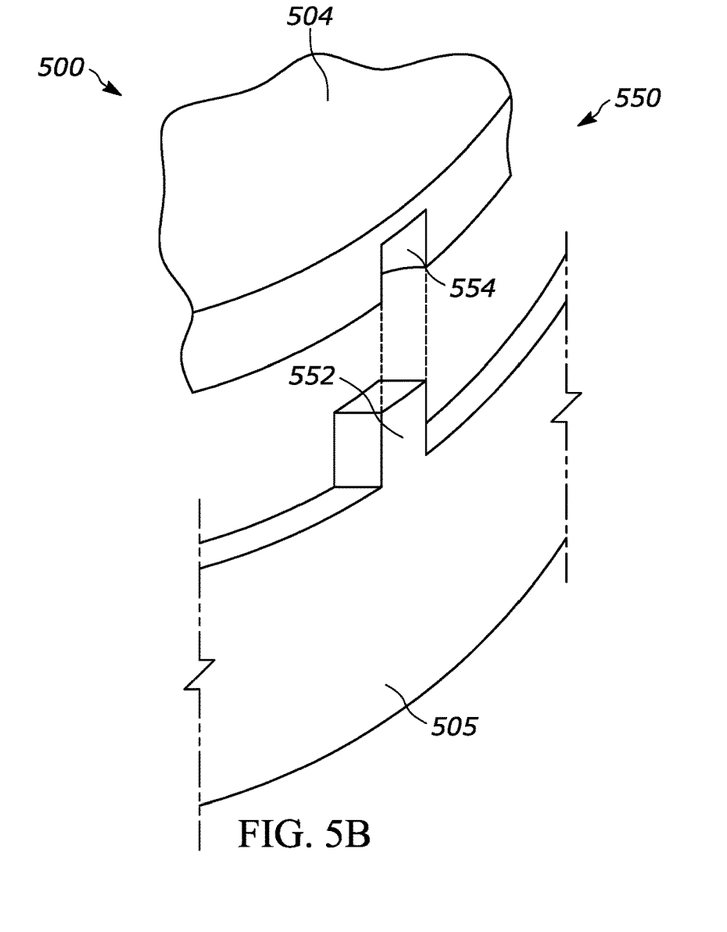
FIG. 5B illustrates one embodiment of a locking mechanism that secures the tube to the substrate carrier in the reactor with centering pin according to the present teaching so as to allow movement of the substrate carrier in the vertical dimension.

FIG. 5B illustrates one embodiment of a locking mechanism 550 that secures the tube 505 to the substrate carrier 504 in the reactor 500 with centering pin according to the present teaching so as to allow movement of the substrate carrier 504 in the vertical dimension. In this embodiment of the reactor 500 for epitaxial deposition, which is described in more detail in connection with FIG. 5A, the substrate carrier 504 is not positioned in direct contact with the rotating tube 505 during normal operation. Also, the centering pin 502 does not provide torque to rotate the substrate carrier 504. Instead, the locking mechanism 550 secures the tube 505 to the substrate carrier 504 so that the tube 505 rotates the substrate carrier 504.

Referring to both FIGS. 5A and 5B, the locking mechanism 550 includes at least one pin 552 formed on the top surface of the tube 505 or attached thereto and a corresponding insert 554 formed in the bottom surface of substrate carrier 504. The insert 554 is dimensioned to receive the pin 552. The dimensions of the pin 552 and the insert 554 are selected to maintain a particular gap 512 between the tube 505 and the substrate carrier 504 so that during operation, the frustoconical-shaped outer surface of the aperture 510 can move vertically into and out of the frustoconical-shaped outer surface of the aperture 510 while still maintaining the gap 512 so that it is wide enough to prevent the substrate carrier 504 from contacting the tube 505.

Figure 5C:
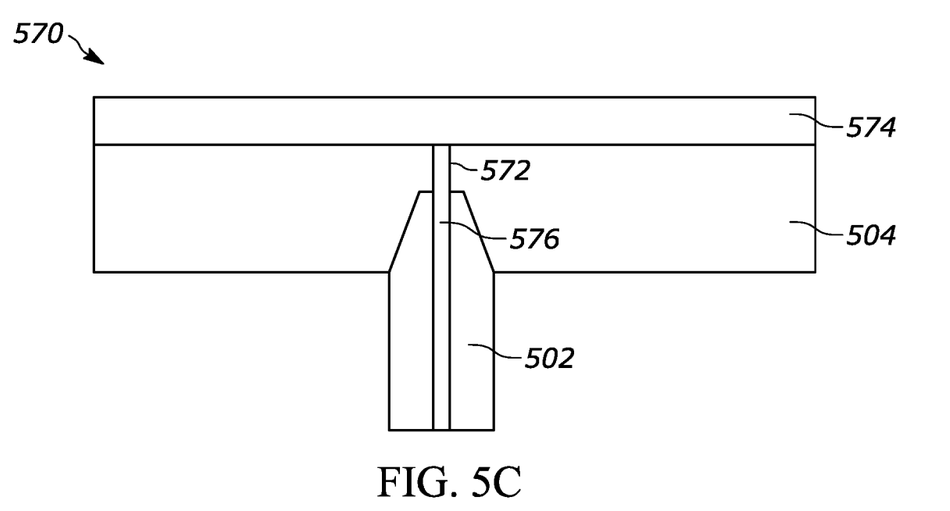
FIG. 5C illustrates an expanded cross-sectional view of one embodiment of the substrate carrier and the centering pin of the reactor with centering pin according to the present teaching for epitaxial deposition that is described in connection with FIGS. 5A and 5B.

FIG. 5C illustrates an expanded cross-sectional view 570 of one embodiment of the substrate carrier 504 and the centering pin 502 of the reactor 500 according to the present teaching for epitaxial deposition that is described in connection with FIGS. 5A-B. Referring to FIGS. 5A-5C, in this particular embodiment, the substrate carrier 504 comprises a vertical conduit 572 for applying a vacuum to the pocket 508 to hold a substrate 574 positioned in the pocket 508 in the substrate carrier 504. The centering pin 502 also includes a corresponding vertical conduit 576 having a top aperture that aligns to a bottom aperture of the vertical conduit 572 in the substrate carrier 504 whereby the apertures couple with at least a partially airtight connection.

During operation, the vertical conduit 576 is coupled to a vacuum source, such as a mechanical vacuum pump that pulls a vacuum on the substrate 574 positioned in the pocket 508 on the substrate carrier 504 to hold the substrate 574 more firmly in place in the pocket 508 during processing. This vacuum applied to the substrate 574 during processing will reduce wobble of the substrate 574 in the pocket 508 and also result in a more uniform temperature distribution, which will result in more accurate and consistent process controls with higher yield. In addition, the vertical conduit 576 can be used to supply gas having relatively high thermal conductivity, such as $H_2$, He, in the space between substrate carrier 504 and substrate 574. Supplying the relatively high thermal conductivity gas in this way improves substrate temperature uniformity.

Figure 5D:
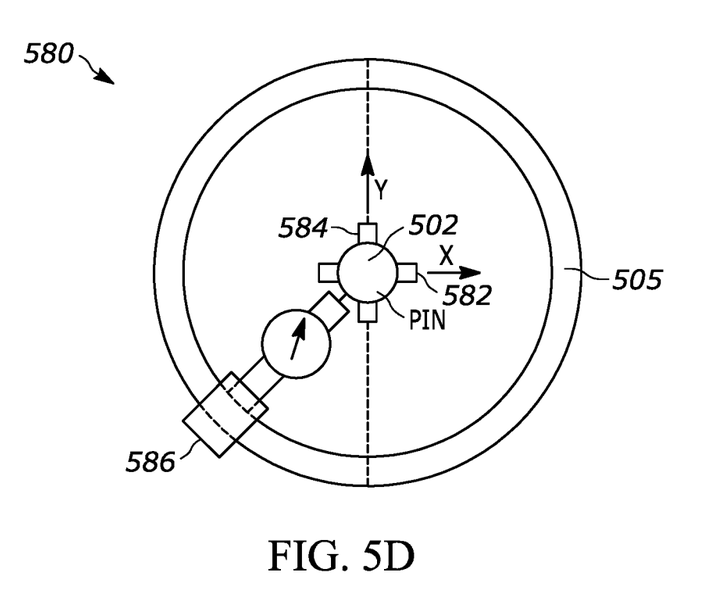
FIG. 5D illustrates a bottom view of embodiments of the tube and the centering pin of the reactor according to the present teaching for epitaxial deposition that is described in connection with FIGS. 5A-C, which includes a translation mechanism for translating the centering pin relative to the aperture and a measurement device for measuring misalignment between the tube and the substrate carrier.

FIG. 5D illustrates a bottom view 580 of embodiments of the tube 505 and the centering pin 502 of the reactor 500 according to the present teaching for epitaxial deposition that is described in connection with FIGS. 5A-C which includes a two-dimensional translation mechanism 582, 584 for translating the centering pin relative to the aperture and a measurement device 586 for measuring misalignment between the tube 505 and the centering pin 502. In various embodiments, a reactor according to the present teaching can have one or both of the two-dimensional translation mechanism 582, 584 and the measuring device 586. Also, in some embodiments, only a one-dimensional translation mechanism can be used.

The two-dimensional translation mechanism includes a translation stage 582 operating to translate the centering pin 502 the X-direction and translation stage 584 operating to translate the centering pin 502 in the Y-direction. The combination of the two translation stages 582, 584 provides a positioning mechanism to align the centering pin 502 with respect to the substrate carrier 505 before processing as well as during processing to provide dynamic stabilization of the substrate carrier 505.

The measurement device 586 measures the distance from the tube 505 to the centering pin 502. Numerous types of measurement device can be used. In some methods of operation, the translation stages 582, 584 operate in response to measurements from the measuring device 586 to keep the centering pin 502 in a desired location.

Figure 6:
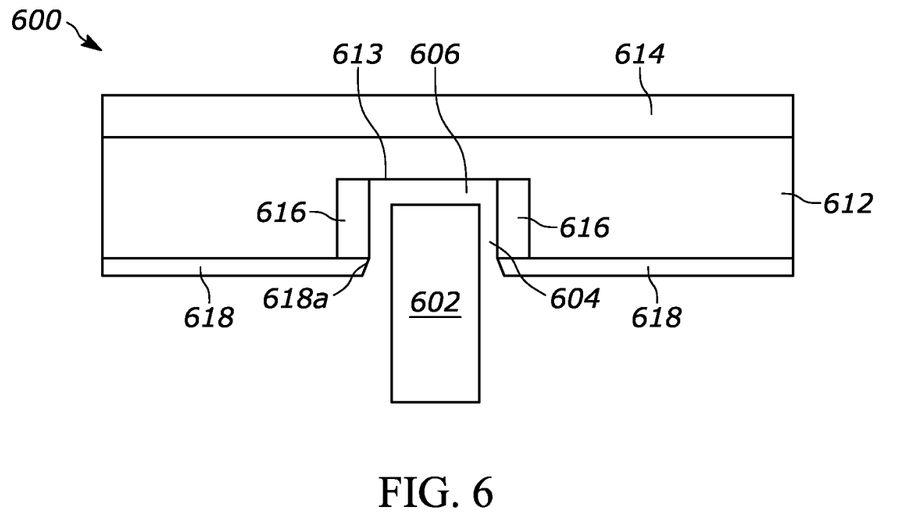
FIG. 6 illustrates another expanded cross-sectional view of the substrate carrier having a bushing in the aperture and the centering pin of the reactor according to the present teaching for epitaxial deposition that is described in connection with FIG. 1.

FIG. 6 illustrates an expanded cross-sectional view 600 of the substrate carrier 100 and the centering pin 602 according to another present teaching for epitaxial deposition that is described in connection with FIG. 1. This expanded view 600 shows a portion of the substrate carrier 612 proximate to the centering pin 602. The pocket 614 that holds the substrate on the top surface of the substrate carrier 612 is also shown. Bushing 616 is pressed into aperture 613 prior to substrate carrier 100 being coated with silicon carbide 618 (or other related material, for example, tantalum carbide, or carbides of other transition metals). The inner surface of bushing 616 is protected such that no silicon carbide coating is deposited on bushing 616. Lip 618a of silicon carbide coating 618 then prevents the bushing 616 from sliding out of aperture 613.

The expanded view 600 shown in FIG. 6 more clearly illustrates the position of the centering pin 602 relative to bushing 616 which is mounted within aperture 613. In particular, the expanded view 600 shows that there is a gap 606 in the vertical direction between the vertical outer surface of the centering pin 602 and the vertical outer surface of the bushing 616. In addition, the expanded view 600 shows that there is a gap 604 in the horizontal dimension between the top surface of the centering pin 602 and the adjacent bottom surface of the aperture 613. The dimensions of the centering pin 602, the dimensions of the bushing 616, and the dimensions of the aperture 613 are chosen so that both the vertical gap 606 and the horizontal gap 604 are present at room temperature when the substrate carrier 612 is at rest. During rotation of the substrate carrier 612, both the vertical gap 606 and the horizontal gap 604 will change as a function of rotation rate and also as a function of operating temperature. The center of bushing 616 is also centered along the geometrical center axis of rotation of the substrate carrier 612.

EQUIVALENTS

While the applicant's teaching is described in conjunction with various embodiments, it is not intended that the applicant's teaching be limited to such embodiments. On the contrary, the applicant's teaching encompass various alternatives, modifications, and equivalents, as will be appreciated by those of skill in the art, which may be made therein without departing from the spirit and scope of the teaching.

What is claimed is:

1. A substrate reactor for epitaxial deposition, the substrate reactor comprising:
   a) a vacuum chamber;
   b) a tube configured to rotate in the vacuum chamber around a tube geometrical center axis;
   c) a substrate carrier forming a pocket on a top surface, the pocket being dimensioned for holding at least one substrate, and forming an aperture comprising a chamfered bottom surface that is centrally located on a bottom surface, the substrate carrier being positioned proximate to a top surface of the tube and configured to maintain a gap therebetween at room temperature, the tube configured to rotate the substrate carrier; and
   d) a centering pin comprising a chamfered top surface, wherein the aperture is dimensioned to receive the centering pin comprising the chamfered top surface, the centering pin being positioned along a geometrical center axis of rotation of the substrate carrier so that the substrate carrier rotates about the centering pin, the centering pin having a first end positioned in the aperture on the bottom surface of the substrate carrier and a second end being fixed inside the reactor so that the substrate carrier rotates around the geometrical center axis of the substrate carrier independent of the geometrical center axis of the tube.

2. The substrate reactor of claim 1 wherein the substrate carrier is configured to rotate along with the tube so that the substrate carrier expands and contracts as a function of temperature along a horizontal plane on the top surface of the tube allowing the substrate carrier and the tube to experience stress only from frictional contact.

3. The substrate reactor of claim 1 wherein a diameter of the aperture on the bottom surface of the substrate carrier is larger than a diameter of the centering pin so that a gap in a horizontal dimension is formed therebetween at room temperature.

4. The substrate reactor of claim 1 wherein the centering pin is dimensioned and positioned so that there is a gap in a vertical dimension between a tip of the first end of the centering pin and a bottom surface of the aperture in the substrate carrier at room temperature.

5. The substrate reactor of claim 1 wherein an outer surface of the first end of the centering pin is formed in a frustoconical shape and an outer surface of the aperture that is centrally located on the bottom surface of the substrate carrier is formed in a corresponding frustoconical shape forming a gap therebetween.

6. The substrate reactor of claim 5 wherein the gap between the outer surface of the frustoconical-shaped first end of the centering pin and the corresponding outer surface of the frustoconical-shape aperture is parallel.

7. The substrate reactor of claim 1 further comprising an alignment mechanism that aligns the substrate carrier to its geometrical center axis.

8. The substrate reactor of claim 1 wherein the centering pin is dimensioned and positioned so that a vertical surface of the first end is in contact with a vertical surface of the aperture on the bottom surface of the substrate carrier at room temperature.

9. The substrate reactor of claim 1 wherein a second end of the centering pin is attached to the vacuum chamber.

10. The substrate reactor of claim 1 wherein the tube is formed of a material selected from the group consisting of quartz, boron nitride, ceramic material, silicon carbide, a refractory material, and graphite.

11. The substrate reactor of claim 1 wherein the substrate carrier is formed of a material selected from the group consisting of graphite, silicon carbide, silicon, a refractory material, and a ceramic material.

12. The substrate reactor of claim 1 wherein the centering pin is formed of a material selected from the group consisting of a refractory material, silicon carbide, a ceramic material, and silicon carbide.

13. A substrate reactor for epitaxial deposition, the substrate reactor comprising:
    a) a vacuum chamber;
    b) a tube configured to rotate in the vacuum chamber around a tube geometrical center axis;
    c) a substrate carrier forming a pocket on a top surface, the pocket being dimensioned for holding at least one substrate, and forming an aperture with a frustoconical-shaped outer surface that is centrally located on a bottom surface, the substrate carrier being positioned proximate to a top surface of the tube and configured to maintain a gap therebetween at room temperature, the tube configured to rotate the substrate carrier; and
    d) a centering pin positioned along a geometrical center axis of rotation of the substrate carrier with a first end that forms a frustoconical-shaped outer surface that fits into the aperture with the frustoconical-shaped outer surface on the bottom surface of the substrate carrier, and a second end that is fixed inside the substrate reactor so that the substrate carrier rotates around the geometrical center axis of rotation of the substrate carrier independent of the tube geometrical center axis, wherein the substrate carrier is positioned proximate to a top surface of the tube forming a gap therebetween at room temperature, and the frustoconical-shaped outer surface of the aperture is in direct contact with the frustoconical-shaped outer surface of the first end of the centering pin so that a gap is formed in the vertical dimension between a tip of the first end of the centering pin and a surface of the aperture.

14. The substrate reactor of claim 13 further comprising a locking mechanism that secures the tube to the substrate carrier so as to allow movement in the vertical dimension.

15. The substrate reactor of claim 14 wherein the locking mechanism comprises a pin formed on the top surface of the tube and a corresponding insert formed in a bottom surface of substrate carrier that is dimensioned to receive the pin.

16. The substrate reactor of claim 13 wherein the substrate carrier comprises a vertical conduit for applying a vacuum to hold a substrate positioned in the pocket on the substrate carrier.

17. The substrate reactor of claim 16 wherein the centering pin further comprises a vertical conduit that aligns to the vertical conduit in the substrate carrier for applying the vacuum to hold the substrate positioned in the pocket on the substrate carrier.

18. The substrate reactor of claim 13 wherein the substrate carrier comprises a vertical conduit for supplying a gas.

19. The substrate reactor of claim 13 further comprising a measurement device attached to the tube that measures misalignment between the tube and the substrate carrier.

20. The substrate reactor of claim 13 further comprising a translation mechanism that translates the centering pin relative to the substrate carrier along at least one axis.

21. The substrate reactor of claim 13 wherein the tube is formed of a material selected from the group consisting of quartz, boron nitride, ceramic material, silicon carbide, a refractory material, and graphite.

22. The substrate reactor of claim 13 wherein the substrate carrier is formed of a material selected from the group consisting of graphite, silicon carbide, silicon, a refractory material, and a ceramic material.

23. The substrate reactor of claim 13 wherein the centering pin is formed of a material selected from the group consisting of a refractory material, silicon carbide, a ceramic material, and silicon carbide.

24. A substrate reactor for epitaxial deposition, the substrate reactor comprising:
a) a vacuum chamber;
b) a tube configured to rotate in the vacuum chamber around a tube geometrical center axis;
c) a substrate carrier forming a pocket on a top surface, the pocket being dimensioned for holding at least one substrate, and forming an aperture that is centrally located on a bottom surface, the aperture having secured therein a bushing, wherein the bushing has a center opening positioned along a geometrical center axis of rotation of the substrate carrier, the substrate carrier being positioned proximate to a top surface of the tube and configured to maintain a gap therebetween at room temperature, the tube configured to rotate the substrate carrier; and
d) a centering pin positioned along a geometrical center axis of rotation of the substrate carrier, the centering pin having a first end positioned in the bushing, and a second end being fixed inside the reactor so that the substrate carrier rotates around the geometrical center axis of the substrate carrier independent of the geometrical center axis of the tube.

25. The substrate reactor of claim 24 wherein the substrate carrier is configured to rotate along with the tube so that the substrate carrier expands and contracts as a function of temperature along a horizontal plane on the top surface of the tube allowing the substrate carrier and the tube to experience stress only from frictional contact.

26. The substrate reactor of claim 24 wherein a diameter of the bushing center opening on the bottom surface of the substrate carrier is larger than a diameter of the centering pin so that a gap in a horizontal dimension is formed therebetween at room temperature.

27. The substrate reactor of claim 24 wherein the centering pin is dimensioned and positioned so that there is a gap in a vertical dimension between a tip of the first end of the centering pin and a bottom surface of the bushing in the substrate carrier at room temperature.

28. The substrate reactor of claim 24 further comprising an alignment mechanism that aligns the substrate carrier to its geometrical center axis.

29. The substrate reactor of claim 24 wherein the centering pin is dimensioned and positioned so that a vertical surface of the first end is in contact with a vertical surface of the bushing on the bottom surface of the substrate carrier at room temperature.

30. The substrate reactor of claim 24 wherein a second end of the centering pin is attached to the vacuum chamber.

31. The substrate reactor of claim 24 wherein the tube is formed of a material selected from the group consisting of quartz, boron nitride, ceramic material, silicon carbide, a refractory material, and graphite.

32. The substrate reactor of claim 24 wherein the substrate carrier is formed of a material selected from the group consisting of graphite, silicon carbide, silicon, a refractory material, and a ceramic material.

33. The substrate reactor of claim 24 wherein the centering pin is formed of a material selected from the group consisting of a refractory material, silicon carbide, a ceramic material, and silicon carbide.

34. A substrate carrier for a chemical vapor deposition reactor comprising a plate having a top surface, a bottom surface, and a geometrical center of axis of rotation, the top surface being dimensioned for holding at least one substrate, the bottom surface having a peripheral section and a central section, the central section having formed therein an aperture configured to receive a centering pin, which is centrally located and aligned with the geometrical center of axis of rotation of the plate, the peripheral section adapted to be positioned proximate to a top surface of a tube and is configured to maintain a gap therebetween at room temperature, the tube configured to rotate the substrate carrier and to rotate around a tube geometrical center axis, and the aperture comprising a chamfered bottom surface being dimensioned to receive the centering pin comprising a chamfered top surface along the geometrical center of axis of rotation of the plate such that the plate rotates around the centering pin on the geometrical center of axis of rotation independent of the tube geometrical center axis.

35. The substrate carrier of claim 34 wherein an outer surface of the aperture that is centrally located on the bottom surface of the substrate carrier is formed in a frustoconical shape.

36. The substrate carrier of claim 34 wherein the aperture has secured therein a bushing, the bushing having a center opening positioned along a geometrical center axis of rotation of the substrate carrier.

* * * * *